United States Patent [19]

Murai

[11] Patent Number: 5,323,045
[45] Date of Patent: Jun. 21, 1994

[54] SEMICONDUCTOR SRAM WITH LOW RESISTANCE POWER LINE

[75] Inventor: Ichiro Murai, Tokyo, Japan

[73] Assignee: Nippon Steel Corporation, Tokyo, Japan

[21] Appl. No.: 858,136

[22] Filed: Mar. 27, 1992

[30] Foreign Application Priority Data

Mar. 30, 1991 [JP] Japan .................................. 3-093229
Jun. 7, 1991 [JP] Japan .................................. 3-163613

[51] Int. Cl.$^5$ ............................................. H01L 23/50
[52] U.S. Cl. .................................... 257/380; 257/383; 257/904
[58] Field of Search ................. 257/380, 381, 904, 383

[56] References Cited

U.S. PATENT DOCUMENTS 4,581,815  4/1986  Cheung et al. ....................... 257/904
4,592,128  6/1986  Bourassa ............................. 257/380
4,961,103  10/1990  Saitoh et al. ........................ 257/380

FOREIGN PATENT DOCUMENTS 226067  1/1990  Japan .

*Primary Examiner*—Robert Limanek
*Attorney, Agent, or Firm*—Pollock, Vande Sande & Priddy

[57] ABSTRACT

A semiconductor device applicable to/an SRAM and the like provided with a flip-flop having a pair of transistors and a pair of high resistance loads and a Vcc line connected to the pair of high resistance loads of the flip-flop and holding a power supply voltage is described. The high resistance loads and the Vcc line have a common semiconductor layer which has an concentration of impurities at a portion forming the Vcc line higher than an concentration of impurities of a portion forming the high resistance loads. Furthermore, by forming a conductive layer such as tungsten on the portion of the semiconductor layer where the impurity concentration is high, the Vcc line is formed by the conductive layer or a cooperation of the conductive layer and the semiconductor layer disposed under the conductive layer. By means of such a structure, the Vcc line is surely made low in resistance, and the data access speed is made faster.

28 Claims, 5 Drawing Sheets

SEMICONDUCTOR SRAM WITH LOW RESISTANCE POWER LINE

FIELD OF THE INVENTION

The present invention relates to a semiconductor device improved to speed up the access time of a semiconductor memory such as a semiconductor LOGIC and an SRAM (static random access memory).

BACKGROUND OF THE INVENTION

As a structure suitable for speeding up the data access time of an SRAM, are examples in which a power supply line is formed in a two-layer structure of a semiconductor layer and a conductive layer, as disclosed in Japanese Patent Unexamined Publication JP-A-(HEI)02-26067 (published on Jan. 29, 1990). According to this reference, a power supply line is formed in a two-layer structure using polycrystalline silicon for the semiconductor layer and tungsten silicide for the conductive layer.

In the structure disclosed in above-mentioned publication, however, there is a possibility that a value of a resistance layer exceeds a designed value and that characteristics do not satisfy desired values since a high resistance semiconductor layer forming a resistance layer extends to a power supply layer. Furthermore, since the conductive layer is formed directly on the high resistance semiconductor layer, there is a possibility that the value of the high resistance layer greatly contributes to the resistance of the power supply layer, in case there is no good contact between both layers is not good. Further, a power supply line is formed by patterning of the conductive layer after the conductive layer is formed on the semiconductor layer in the manufacturing method thereof. Thus, it involves a problem that the resistance value is apt to vary depending on a quantity of etching of the conductive layer on the resistance layer, and it is very difficult to obtain a desired resistance value of the resistance layer.

SUMMARY OF THE INVENTION

The present invention has been made in view of above-described circumstances and has an object to provide a semiconductor device having a structure which is capable of speeding up the access time and can be manufactured as closely to a desired design as possible, and to provide a manufacturing method thereof.

In order to achieve the above object, according to the present invention, a semiconductor device having a flip-flop composed of a pair of transistors and a pair of high resistance loads and a power supply line connected to the pair of high resistance loads of the flip-flop comprises: a semiconductor layer for forming the high resistance loads and the power supply line, a portion of the semiconductor layer, which forms the power supply line, having an impurity concentration higher than that of a portion thereof, which forms the high resistance loads; and a conductive layer formed on the portion of the semiconductor layer having the higher impurity concentration, the conductive layer forming the power supply line with or without a cooperation of the semiconductor layer disposed under the conductive layer. Further, the conductive layer contains a refractory metal. The refractory metal includes one of tungsten, titanium and molybdenum. The conductive layer contains a transition metal aluminum. The conductive layer contains a refractory metal silicide. The refractory metal silicide includes one of tungsten silicide, titanium silicide and molybdenum silicide. The conductive layer includes a polysilicon layer containing high concentration impurities formed by selective growth on the film of the power supply line.

Furthermore, according to the present invention, a semiconductor device having a flip-flop composed of a pair of transistors and a pair of high resistance loads, and a power supply line connected to the pair of high resistance loads of the flip-flop comprises: a semiconductor layer having a first semiconductor layer forming the high resistance loads and a second semiconductor layer having an impurity concentration higher than that of the first semiconductor layer; and a conductive layer formed on the second semiconductor layer and including a portion for forming the power supply line with or without cooperation of the second semiconductor layer. Further, the conductive layer contains a refractory metal. The refractory metal includes one of tungsten, titanium and molybdenum. The conductive layer contains a transition metal or aluminum. The conductive layer contains a refractory metal silicide. The refractory metal silicide includes one of tungsten silicide, titanium silicide and molybdenum silicide. The conductive layer includes a polysilicon layer containing high concentration impurities formed by selective growth on the film of the power supply line.

Furthermore, according to the present invention, a semiconductor device having a circuit configuration in which a power supply line is connected to transistors through high resistance loads comprises: a semiconductor layer connected to one end of each of the transistors and forming the high resistance loads and the power supply line, this semiconductor layer having a first region having a given impurity concentration and performing functions of the high resistance loads and a second region including an area having an impurity concentration higher than that of the first semiconductor region to form the layer of the power supply line; and a conductive layer formed on the second region of the semiconductor layer. Further, the conductive layer contains a polycrystalline silicon. The conductive layer contains a refractory metal, the refractory metal includes one of tungsten, titanium and molybdenum. The second region further includes a third region forming a contact for connecting to one terminal of the transistor. The conductive layer further includes a second conductive layer formed on the third region. The first region contains boron as an impurity and the second region contains phosphorus or boron as an impurity having high concentration.

According to the present invention, sheet resistance is made about 5 to 15 $\Omega$/square as compared with 400 to 6,000 $\Omega$/square in a conventional case, thus making it possible to reduce a resistance value of a power supply wiring to approximately one hundredth of that in a conventional case due to the above-described structure by which, after impurities are introduced into the film of the power supply wiring, a conductive layer composed of a tungsten film and the like is formed on the film of the power supply wiring.

Moreover, it is possible to use for the power supply wiring a refractory metal such as a titanium film, a molybdenum film and a tantalum film, or a refractory metal silicide such as a tungsten silicide film, a titanium silicide film, a molybdenum silicide film and a tantalum silicide film in place of a tungsten film. Furthermore, in case it is aimed at obtaining conductivity, an aluminum film which has been heretofore used as an electrode line of a semiconductor can also be used. Furthermore, in case it is aimed at reducing the resistance value of the power supply wiring to about one tenth, if not to one hundredth, of the conventional value, it is possible to reduce the resistance value of the power supply wiring similarly to the foregoing case by using a polysilicon film in which a large quantity of impurities are injected by selective growth. Further, it is also possible to reduce the resistance value of the power supply wiring by forming a mask of a silicon dioxide film on the film providing the power supply wiring and the resistance portion in the process of growth of the metal film, thereafter selectively forming an opening at a portion of the silicon dioxide film corresponding to the power supply wiring portion and introducing impurities into the opening portion. Besides, the same effects are achieved by using a silicon nitride film, a BPSG film or a PSG film for the mask in place of the silicon dioxide film.

Furthermore, according to the present invention, it is possible to provide a semiconductor device in which the power supply wiring is made with low resistance thereby to make faster the access speed by a simple method in such a manner that a conductive layer such as a metallic film and a polysilicon film is formed after introducing impurities into the film of the power supply wiring. Further, it is possible to provide a semiconductor device in which a power supply wiring is made low in resistance thereby enabling it to make faster the access speed by a simple method similar to the above mentioned method such that impurities are introduced into the film of power supply wiring and thereafter a refractory metal film such as a tungsten film, a titanium film, a molybdenum film and a tantalum film, or a refractory metal silicide film such as an aluminum film, a tungsten silicide film, a titanium silicide film, a molybdenum silicide film and a tantalum silicide film, or a metallic conductive film such as an aluminum film, or a polysilicon film containing impurities at high concentration is formed by selective growth. Further, it is also possible to reduce the resistance value of the power supply wiring thereby providing a semiconductor device capable of making faster the access speed by forming a mask of a silicon dioxide film on the film providing the power supply wiring and the resistance portion in the process of growth of the metal film, thereafter selectively forming an opening at a portion of the silicon dioxide film corresponding to the power supply wiring portion and introducing impurities into the opening portion.

DETAILED DESCRIPTION OF THE PREFERRED EMBODIMENTS

Figure 1:
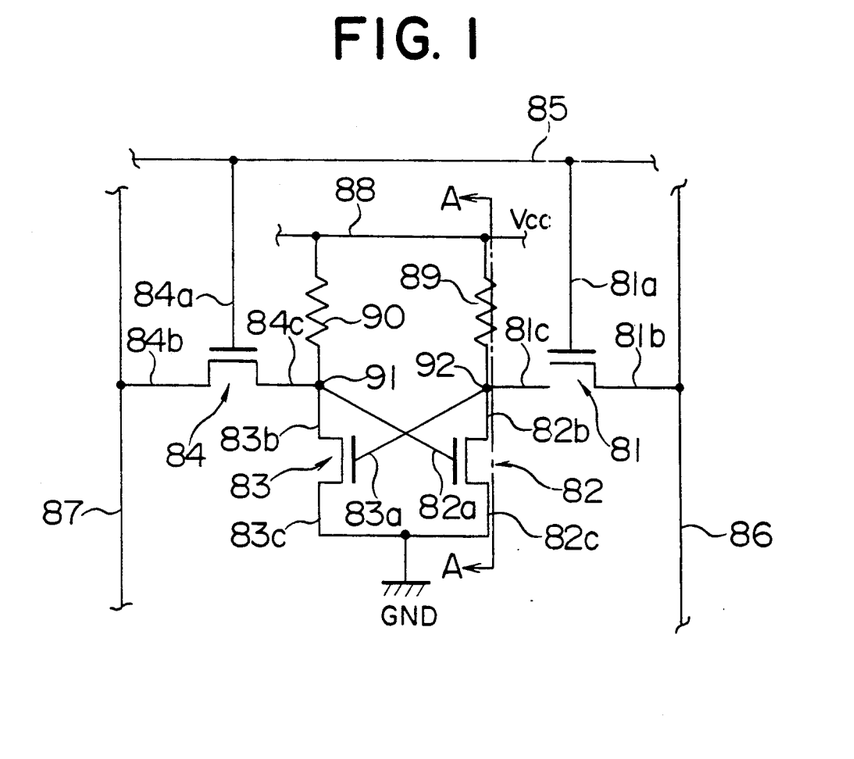
FIG. 1 is a circuit diagram showing a structure of a memory cell of an SRAM according to an embodiment of the present invention.

An embodiment of the present invention will be described hereinafter with reference to the drawings. An SRAM cell shown in FIG. 1 is formed in such a manner that a gate $81a$ of a first N-channel transistor 81 and a gate $84a$ of a fourth N-channel transistor 84 are connected to a selective line (word line) 85, and respective drains $81b$ and $84b$ of the first and fourth N-channel transistors 81 and 84 are connected to two read lines (bit lines) (serving also as write lines) 86 and 87, respectively. Further, a source $81c$ of the first N-channel transistor 81 is connected to a drain $82b$ of a second N-channel transistor 82 and a gate $83a$ of a third N-channel transistor 83, and a source $84c$ of the fourth transistor 84 is connected to a drain $83b$ of the third N-channel transistor 83 and a gate $82a$ of the second N-channel transistor 82. Respective sources $82c$ and $83c$ of the second and the third transistors 82 and 83 are connected to ground (GND). Furthermore, a first impedance element 89 is connected between a power supply line 88 and a drain $82b$ of the second N-channel transistor 82, and a second impedance element 90 is connected between the power supply line 88 and the third N-channel transistor 83.

When bit information is to be written in a memory cell thus constructed, a memory cell shown in FIG. 1 is selected by bringing the selecting line 85 to a high (H) level, and the bit information is writen in this memory cell by bringing one of two read lines (write lines) 86 and 87 to a high (H) level and the other to a low (L) level.

Here, a case when the read line (write line) 86 is set to the L level and the read line (write line) 87 to the H level will be described. First, the first and the fourth transistors 81 and 84 present ON state when the selective line 85 is at the H level. Under this condition, when the read line (write line) 86 is made to the L level and the read line (write line) 87 is made to the H level, the contact 91 is made to the H level, whereby the second transistor 82 is rendered an ON state so that the contact 92 is connected to the ground through this transistor 82 so as to present the L level. Since the contact 92 is brought to the L level, the third transistor 83 is rendered an OFF state. When the selective line 85 returns to the L level in this state, the first and the fourth transistors 81 and 84 are turned to an OFF state, and the contact 91 is held at the H level and the contact 92 is held at the L level. Here, the first and the second impedance elements 89 and 90 are provided for the purpose of supplementing to the respective transistors electric currents from the power supply line 88 correspondingly to the leakage currents of respective transistors in order to prevent the above-described memory state (the state that one of the contacts 91 and 92 presents the H level and the other presents the L level) from being changed in the lapse of time due to the leakage currents. The higher impedance element has an impedance for example, in the order of teraohm. Incidentally, in order to bring the contact 91 to the L level and the contact 92 to the H level, the read line (write line) 86 is made to the H level and the read line (write line) 87 is made to the L level, contrary to the above case.

Figure 2:
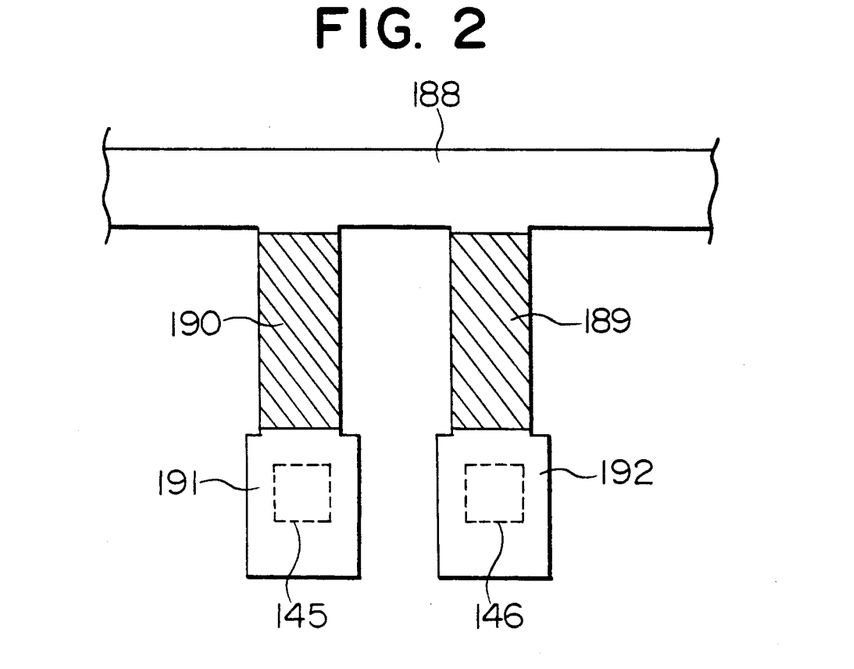
FIG. 2 is a plan view showing a schematic structure of a principal part of the SRAM cell of FIG. 1.

FIG. 2 is a plan view showing a principal part related to the present invention of the SRAM of FIG. 1, i.e., the structure of the power supply line 88, the impedance elements 89 and 90 and the contacts 91 and 92. As shown in FIG. 2, an SRAM of this embodiment is provided with a low resistance power supply line 188 corresponding to the power supply line 88 shown in FIG. 1 and receiving a power supply Vcc, high resistance load resistance sections 189 and 190 corresponding to impedance elements 89 and 90 shown in FIG. 1, a contact 192 corresponding to the contact 92 where the transistors 81, 82 and 83 are connected to the impedance element 89 in FIG. 1, and a contact 191 corresponding to the contact 91 where the transistors 82, 83 and 84 are connected to the impedance element 90 in FIG. 1. Further, the portions shown by broken lines 145, 146 inside the contacts 191 and 192 represent contacts connected to the transistors and corresponding to contact holes 46 shown in FIG. 3.

Figure 3:
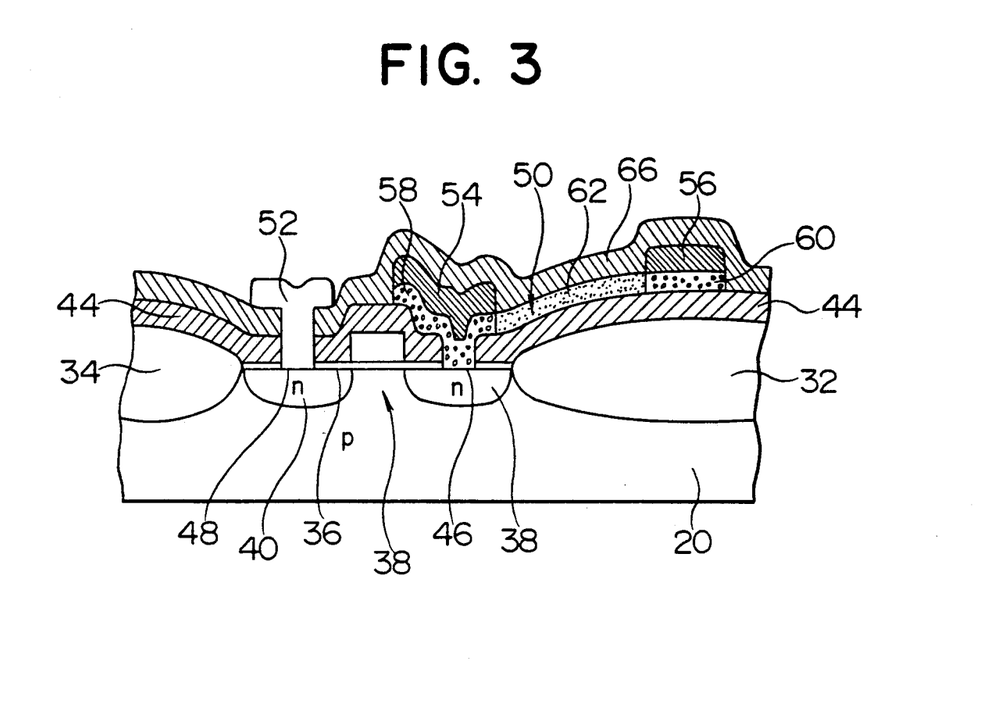
FIG. 3 is a perspective sectional view taken along a line A—A of the SRAM shown in FIG. 1.

FIG. 3 is a perspective sectional view taken along a line A—A of the SRAM shown in FIG. 1. In FIG. 3, a P-type silicon substrate is used for a substrate 20. Element-isolating films 32 and 34 are formed on this substrate 20, and a MOS field effect transistor 30 corresponding to the transistor 82 shown in FIG. 1 is formed between these element isolating films 32 and 34. This MOS field effect transistor 30 includes a drain 38, a source 40 and a gate 42 with an insulating film 36 disposed therebetween. An interlayer insulating film 44 formed of a silicon dioxide is formed on the MOS field effect transistor 30 and the element isolating films 32 and 34. Further, contact holes 46 and 48 are formed at positions opposing to the drain 38 and the source 40 in the interlayer insulating film 44, and a polysilicon film 50 is formed at the contact hole 46 and an aluminum electrode 52 is formed at the contact hole 48, respectively. A tungsten layer 54 is grown selectively on the polysilicon film in the vicinity of the contact hole 46, thus forming the contact 192 shown in FIG. 2. Further, a tungsten layer 56 is also formed on the polysilicon above the element isolating film 32 so as to form the power supply line 188 shown in FIG. 2. Furthermore, arsenic As or phosphorus P is doped in the vicinity of the portions where the polysilicon layer 50 comes into contact with the tungsten layers 54 and 56, thereby to have the portions with low resistance and to make it easier to form tungsten on the polysilicon layer 50. Further, a polysilicon region 62 which is disposed between polysilicon layers 58 and 60 is left as a high resistance region so as to form the resistance 189 shown in FIG. 2. Furthermore, upper surfaces of the tungsten layers 54 and 56 and the polysilicon region 62 are covered by an insulating film 66 formed of as insulating material such as $SiO_2$.

Figure 4:
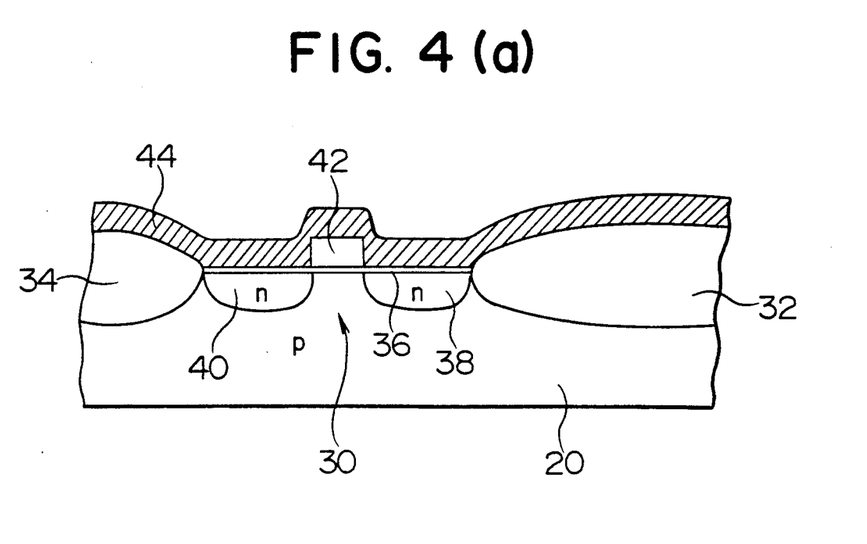
FIGS. 4(a) to 4(g) are explanatory views for explaining the respective steps in a method of manufacturing the SRAM cell shown in FIG. 3.

Next, a method of manufacturing a semiconductor device including an SRAM cell will be described with reference to FIGS. 4(a) to 4(g) for manufacturing the structure of the embodiment shown in FIG. 3 as an example. In FIGS. 4(a) to 4(g), the same numbers as those shown in FIG. 3 indicate the same components. First, as shown in FIG. 4(a), after forming the element isolating films 32 and 34 and the MOS field effect transistor 30 on the p-type silicon substrate 20 using well-known technique, the interlayer insulating film 44 is formed of a silicon dioxide film by a well-known CVD method. Then, as shown in FIG. 4(b), after the contact hole 46 for making an electrical connection to the drain 38 is formed in the interlayer insulating film 44 by well-known micro lithography technique, the polysilicon film 50 is formed by a well-known CVD method. The film thickness of the polysilicon film 50 is in a range of about 500 Å to 1,500 Å.

Next, impurities are doped by injecting B+ (boron) ions 63 into the polysilicon film 50 by well-known ion injection technique under the condition of $1 \times 10^{12}$–$10^{13}$ ions/$cm^2$ and an energy of approximately 30 kev–50 kev as shown in FIG. 4(c). At this time, the conditions are set so that the ions are distributed almost uniformly in the film.

Thereafter, patterning is applied to the polysilicon film 50 by well-known photolithography technique as shown in FIG. 4(d).

Next, as shown in FIG. 4(e), a silicon dioxide film 65 is formed at a thickness in a range of about 1,000 Å to 3,000 Å, patterning the film by well-known micro lithography technique and masking by an insulating film mask 65 of the silicon dioxide film a portion 62 of the polysilicon film 50 which is used for load resistance sections 189 and 190 as shown in FIG. 2 and a portion of the interlayer insulating film 44 where the polysilicon film 50 is removed by etching. Thereafter, impurities are doped by injecting arsenic or phosphorus ions 67 by well-known ion injection technique. It is required to perform this processing under such conditions that the ion concentration in the polysilicon film 50 becomes approximately $1 \times 10^{20}$ – $1 \times 10^{21}$ atoms/$cm^3$. Due to the doping of impurities, the resistance values of the tungsten electrode formed thereafter and the polysilicon films 58 and 60 formed under the power supply line are reduced and additionally selective deposition of the tungsten electrode becomes easy.

Next, as shown in FIG. 4(f), tungsten layers 54 and 56 are grown by well-known tungsten selective deposition technique on the portions 58 and 60 of the polysilicon film 50 where the contacts 91 and 92 and the Vcc line 188 as shown in FIG. 2 are formed. At this time, it is desirable to form the tungsten layers 54 and 56 in a thickness similar to that of the insulating film mask 65 thereby making them in flat. Then, as shown in FIG. 4(g), the insulating film mask 65 is removed by well-known hydrofluoric acid etching technique after the tungsten layers 54 and 56 are deposited.

Lastly, as shown in FIG. 3, a contact hole 48 for making an electrical connection to the source 40 is formed by well-known micro lithography technique after forming the insulating film 66, and thereafter an aluminum contact 52 to be connected to GND as shown in FIG. 1 is formed by well-known technique.

According to the above-described embodiment, it is possible to make the Vcc line 188 low in resistance easily, thus improving the access speed as compared with a conventional device by forming the Vcc line 188 shown in FIG. 2 growing the tungsten film 56 selectively after selectively injecting impurities selectively into the portion 60 of the polysilicon film 50 other than its portion 62 which is about to be made to high resistance.

Further, in the above embodiment, after introducing impurities into the film of the power supply wiring, a tungsten film is further formed on that film. Thus, a sheet resistance is improved about 5 to 15 $\Omega/cm^2$ from 400 to 600 $\Omega/cm^2$ of a conventional case, thus making it possible to reduce the resistance value of the power supply wiring to approximately one hundredth of that of conventional sheet resistance.

Further, it is possible to use a refractory metal film such as a titanium film, a molybdenum film and a tantalum film, or a refractory metal silicide film such as a tungsten silicide film, a titanium silicide film, a molybdenum silicide film and a tantalum silicide film for the power supply wiring in place of the tungsten film. Furthermore, in case it is desired to improve conductivity, an aluminum film which has been heretofore used as an electrode line of a semiconductor can also be used. Furthermore, in case it is aimed at reducing the resistance value of the power supply wiring to about one tenth, if not to one hundredth, of the conventional value, it is possible to reduce the resistance value of the power supply wiring similarly to the foregoing case by using a polysilicon film in which a large quantity of impurities are injected by selective growth. Further, it is also possible to reduce the resistance value of the power supply wiring by forming a mask of a silicon dioxide film on the film providing the power supply wiring and the resistance portion in the process of deposition of the metal film, thereafter selectively forming an opening at a portion of the silicon dioxide film corresponding to the power supply wiring portion and introducing impurities into the opening portion. The same effects are achieved by using a silicon nitride film, a BPSG film or a PSG film for the mask in place of the silicon dioxide film.

Thus, according to the present invention, it is possible to provide a semiconductor device in which the power supply wiring is made with low resistance whereby to make faster the access speed by a simple method in such a manner that a conductive layer such as a metallic film and a polysilicon film is formed after introducing impurities into the film of the power supply wiring. Further, it is possible to provide a semiconductor device in which a power supply wiring is made low in resistance thereby enabling it to make faster the access speed by a simple method similar to the above-mentioned method such that impurities are introduced into the film of power supply wiring and thereafter a refractory metal film such as a tungsten film, a titanium film, a molybdenum film and a tantalum film, or a refractory metal silicide film such as an aluminum film, a tungsten silicide film, a titanium silicide film, a molybdenum silicide film and a tantalum silicide film, or a metallic conductive film such as an aluminum film, or a polysilicon film containing impurities at high concentration is formed by selective growth. Further, it is also possible to reduce the resistance value of the power supply wiring thereby providing a semiconductor device capable of making faster the access speed by forming a mask of a silicon dioxide film on the film providing the power supply wiring and the resistance portion in the process of deposition of the metal film, thereafter selectively forming an opening at a portion of the silicon dioxide film corresponding to the power supply wiring portion and introducing impurities into the opening portion.

I claim:

1. A semiconductor device provided with a flip-flop having a pair of transistors and a pair of high resistance loads and a power supply line connected to said pair of high resistance loads of said flip-flop; said semiconductor device further comprising:
   a semiconductor layer for forming said high resistance loads and said power supply line and having an impurity concentration at a first portion forming said power supply line higher than an impurity concentration at a second portion forming each of said high resistance loads; and
   a conductive layer formed on the first portion of the semiconductor layer having the higher impurity concentration, the power supply line being formed by a cooperation of the conductive layer with a semiconductor layer disposed under the conductive layer;
   wherein the second portion of said semiconductor layer forming each of said high resistance loads is branched off from the first portion of the semiconductor layer on which the conductive layer is formed and extends to a diffusion layer forming one of said transistors.

2. A semiconductor device according to claim 1, wherein said conductive layer contains a refractory metal.

3. A semiconductor device according to claim 2, wherein said refractory metal includes one of tungsten, titanium, and molybdenum.

4. A semiconductor device according to claim 1, wherein said conductive layer contains a transition metal.

5. A semiconductor device according to claim 4, wherein said conductive layer includes aluminum.

6. A semiconductor device according to claim 1, wherein said conductive layer contains a refractory metal silicide.

7. A semiconductor device according to claim 6, wherein said refractory metal silicide includes one of tungsten silicide, titanium silicide and molybdenum silicide.

8. A semiconductor device according to claim 1, wherein said conductive layer includes a polysilicon layer containing impurities at high concentration and formed by selective growth on the first portion of said semiconductor layer having the higher impurity concentration.

9. A semiconductor device provided with a flip-flop having a pair of transistors and a pair of high resistance loads and a power supply line connected to said pair of high resistance loads of said flip-flop; said semiconductor device further comprising:
   a semiconductor layer having a first semiconductor layer forming each of said high resistance loads and a second semiconductor layer having an impurity concentration higher than that of said first semiconductor layer; and
   a conductive layer formed on said second semiconductor layer, said power supply line being formed by a cooperation of said conductive layer with said second semiconductor layer;
   wherein said first semiconductor layer forming each of said high resistance loads is branched off from the second semiconductor layer on which the conductive layer is formed and extends to a diffusion layer forming one of said transistors.

10. A semiconductor device according to claim 9, wherein said conductive layer contains a refractory metal.

11. A semiconductor device according to claim 10, wherein said refractory metal includes one of tungsten, titanium and molybdenum.

12. A semiconductor device according to claim 9, wherein said conductive layer contains a transition metal.

13. A semiconductor device according to claim 9, wherein said conductive layer includes aluminum.

14. A semiconductor device according to claim 9, wherein said conductive layer contains a refractory metal silicide.

15. A semiconductor device according to claim 14, wherein said refractory metal silicide includes one of tungsten silicide, titanium silicide and molybdenum silicide.

16. A semiconductor device according to claim 9, wherein said conductive layer includes a polysilicon layer containing impurities at high concentration and formed on said second semiconductor layer by selective growth.

17. A semiconductor device having a circuit configuration in which a power supply line is connected to respective ends of transistors through high resistance loads, said semiconductor device comprising:
   a semiconductor layer connected to terminals of the transistors and forming layers of the high resistance loads and the power supply line, said semiconductor layer having a first region having a given impurity concentration and performing functions of said high resistance higher than that of the first semiconductor region and forming a layer of said power supply line; and
   a conductive layer formed on the second region of said semiconductor layer, the power supply line being formed by a cooperation of the conductive layer with the second region of said semiconductor layer.

18. A semiconductor device according to claim 17, wherein said semiconductor layer contains a polycrystalline silicon.

19. A semiconductor device according to claim 17, wherein said conductive layer contains a refractory metal.

20. A semiconductor device according to claim 19, wherein said refractory metal includes one of tungsten, titanium and molybdenum.

21. A semiconductor device according to claim 17, wherein said second region further includes a third region forming a contact to be connected to one terminal of the transistor.

22. A semiconductor device according to claim 21, wherein said conductive layer further includes a second conductive layer formed on said third region.

23. A semiconductor device according to claim 17, wherein said first region contains boron as an impurity.

24. A semiconductor device according to claim 17, wherein said second region contains phosphorus or boron as an impurity having high concentration.

25. A semiconductor device according to claim 1, wherein said semiconductor layer contains a polycrystalline silicon.

26. A semiconductor device according to claim 9, wherein said semiconductor layer contains a polycrystalline silicon.

27. A semiconductor device having at least one transistor which is connected through a high resistance load to a power supply line, said semiconductor device comprising:
   a semiconductor layer having a first region, a second region having a resistance higher than that of said first region, said second region extending from said first region toward a diffusion layer of said transistor, and a third region which extends from said second region to the diffusion layer of said transistor so that said third region is in contact with said diffusion layer; and
   a conductive layer formed in direct contact with said first region of said semiconductor layer, two layers of said conductive layer and said first region of said semiconductor layer providing said power supply line.

28. A semiconductor device providing a flip-flop having a pair of transistors, each having diffusion layers of source and drain, and a pair of high resistance loads and a power supply line connected to said high resistance loads, said semiconductor device comprising:
   a semiconductor layer having a first region, a second region having a resistance higher than that of said first region and extending toward one of the diffusion layers of one of said transistor, a third region having a resistance higher than that of said first region and extending from said first region toward one of the diffusion layers of the other of said transistors, a fourth region connecting said second region to the diffusion layer of said one transistor, an a fifth region connecting said third region to the one of the diffusion layers of the other transistors; and
   a conductive layer formed in direct contact with the first region of said semiconductor layer, two layers of said conductive layer and said first region of said semiconductor layer providing said power supply line.

* * * * *